US008837250B2

(12) United States Patent
Xiao et al.

(10) Patent No.: US 8,837,250 B2
(45) Date of Patent: Sep. 16, 2014

(54) METHOD AND APPARATUS FOR WORD LINE DECODER LAYOUT

(75) Inventors: You-Cheng Xiao, Taiping (TW);
Hong-Chen Cheng, Hsinchu (TW);
Chung-Ji Lu, Fongyuan (TW); Cheng Hung Lee, Hsinchu (TW); Jung-Hsuan Chen, Hsinchu (TW); Li-Chun Tien, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 252 days.

(21) Appl. No.: 12/839,490

(22) Filed: Jul. 20, 2010

(65) Prior Publication Data
US 2012/0020179 A1 Jan. 26, 2012

(51) Int. Cl.
*G11C 8/10* (2006.01)

(52) U.S. Cl.
USPC .................................... 365/230.06

(58) Field of Classification Search
None
See application file for complete search history.

(56) References Cited

U.S. PATENT DOCUMENTS

| 6,275,442 | B1 * | 8/2001 | Hill et al. ................. 365/230.06 |
| 6,560,163 | B2 * | 5/2003 | Akita et al. .............. 365/230.06 |
| 6,636,448 | B2 * | 10/2003 | Koshikawa ................... 365/201 |
| 7,215,587 | B2 | 5/2007 | Lee et al. |
| 7,898,896 | B2 | 3/2011 | Miyanishi |
| 2001/0002883 | A1 * | 6/2001 | Akita et al. ...................... 365/63 |
| 2001/0014032 | A1 * | 8/2001 | Nakamura et al. ............. 365/120 |
| 2001/0040827 | A1 * | 11/2001 | Dosaka et al. ........... 365/189.01 |
| 2001/0050870 | A1 | 12/2001 | Koshikawa |
| 2003/0179635 | A1 * | 9/2003 | Terzioglu et al. ............. 365/201 |
| 2007/0047283 | A1 * | 3/2007 | Miyanishi ....................... 365/51 |

FOREIGN PATENT DOCUMENTS

| CN | 1921000 A | 2/2007 |
| JP | 05-258574 | 10/1993 |
| JP | 09-022989 | 1/1997 |
| JP | 2003-124319 | 4/2003 |
| JP | 2006-108510 | 4/2006 |
| JP | 2007-019997 | 1/2007 |
| JP | 2010-257552 | 11/2010 |

OTHER PUBLICATIONS

Official Action issued Nov. 20, 2012 in counterpart JP Patent Application No. 2011-007334.

* cited by examiner

*Primary Examiner* — Hoai V Ho
*Assistant Examiner* — James G Norman
(74) *Attorney, Agent, or Firm* — Duane Morris LLP

(57) ABSTRACT

A word line decoder comprises a plurality of driver circuits, a plurality of word lines provided at respective outputs of the driver circuits, and a plurality of primary input lines coupled to the driver circuits and oriented in a first direction. The word line decoder also comprises a plurality of secondary input lines coupled to the driver circuits and oriented in the first direction. The word line decoder also comprises a local decode line coupled to each of the primary input lines. The word line decoder also comprises a decode line coupled to the local decode line and oriented in the first direction. A cluster decode line is coupled to the decode line. The word line decoder is configured to select at least one of the word lines based on signals provided by the cluster decode line and the secondary input lines.

19 Claims, 10 Drawing Sheets

METHOD AND APPARATUS FOR WORD LINE DECODER LAYOUT

BACKGROUND

Static random access memory (SRAM) is a type of semiconductor memory that stores data in the form of bits using bistable circuitry without the need for refreshing. FIG. 1 is a circuit diagram of a known type of SRAM. FIG. 1 shows an SRAM memory cell 100 (also known as a bitcell) with six metal oxide semiconductor (MOS) transistors in a configuration known as 6T (six transistors), although SRAM configurations with other numbers of transistors are available as well. NMOS transistor 110 and PMOS transistor 120 are coupled to form an inverter, and NMOS transistor 130 and PMOS transistor 140 are coupled to form another inverter. The two inverters are cross-coupled to provide bistable memory storage, with a bit and its complement stored at nodes Q and Q_INV, respectively. PMOS transistors 120, 140 are coupled to a power supply voltage VDD, and NMOS transistors 110, 130 are coupled to a ground node. NMOS transistors 150, 160 are known as access transistors because they provide access to bit lines BL, BL_INV. A gate of each of the access transistors 150, 160 is coupled to a word line WL that controls whether the access transistors 150, 160 are connected to the bit lines BL, BL_INV.

The bit cell has three different states or modes of operation. In a standby mode, word line WL is not asserted, and access transistors 150, 160 are therefore disconnected from bit lines BL, BL_INV. The cross-coupled inverters formed by transistors 110, 120 and transistors 130, 140, respectively reinforce each other to maintain a bit and its complement at nodes Q and Q_INV, respectively. In a read mode, bit lines BL and BL_INV are initially precharged to a logical high value ('1'). Then, word line WL is asserted, thereby enabling access transistors 150, 160. The data values stored at nodes Q, Q_INV are transferred to bit lines BL, BL_INV. For example, if the content of bit cell 100 is '1' (i.e., if Q is '1' and Q_INV is '0'), BL remains high and BL_INV is discharged through transistors 150 and 110 to a logical low value ('0'). If the content of bit cell 100 is '0', BL remains at '0' and BL_INV is pulled up to '1'. In a write mode, the data value to be written to bit cell 100 is applied to bit lines BL, BL_INV by setting BL to the desired value and BL_INV to its complement. Then, word line WL is asserted, causing the desired value to be latched into the cross-coupled inverters.

FIG. 2 is a circuit diagram of a known word line decoder 200 configured to connect to SRAM bitcells in order to store multiple data bits. A plurality of word lines WL[0], WL[1],..., WL[31] are provided at the outputs of respective driver circuits 210-0, 210-1, ..., 210-31 (generally 210), which may be logical AND gates. Each driver circuit 210 has a plurality of input lines that are coupled, e.g., using interconnects, to decoder lines DEA[0], DEA[1], DEB[0], DEB[1], and DEC[0], DEC[7] to determine whether the corresponding word line is asserted (at a logical high value). In FIG. 2, an example configuration with 32 word lines is shown; therefore, $\log_2 32$ (or 5) bits of information are used to select the driver circuits 210. In this example, the 5 bits are provided by decode lines DEA[0], DEA[1] contributing one bit of information, decode lines DEB[0], DEB[1] contributing one bit of information, and decode lines DEC[0], DEC[7] contributing three bits of information. Using three input lines in the example of FIG. 2, driver circuits 210 are thus presented with 32 different possible input combinations. For example, decode lines DEC[1], DEB[1], and DEA[1] are asserted (logical high) in order to assert word line WL[7].

SUMMARY

In some embodiments, a word line decoder is disclosed. The word line decoder comprises a plurality of driver circuits, a plurality of word lines provided at respective outputs of the driver circuits, and a plurality of primary input lines coupled to the driver circuits and oriented in a first direction. The word line decoder also comprises a plurality of secondary input lines coupled to the driver circuits and oriented in the first direction. The word line decoder also comprises a local decode line coupled to each of the primary input lines. The word line decoder also comprises a decode line coupled to the local decode line and oriented in the first direction. A cluster decode line is coupled to the decode line. The word line decoder is configured to select at least one of the word lines based on signals provided by the cluster decode line and the secondary input lines.

In some embodiments, a memory device has a plurality of word lines, a plurality of static random access memory (SRAM) cells configured to store a plurality of data bits, a control logic, an input output array, and a word line decoder. Each SRAM cell is activated by a corresponding word line. The control logic is configured to provide first and second pluralities of decode signals on first and second pluralities of decode lines, respectively The input output array is configured to read and write the data bits based on input from the control logic. The word line decoder comprises a plurality of driver clusters, a plurality of local decode lines, and a third plurality of decode lines. Each driver cluster comprises a plurality of driver circuits, with an output of each driver circuit providing a corresponding word line. Each local decode line is coupled to the driver circuits of a corresponding driver cluster via corresponding ones of a plurality of input lines oriented in a first direction. The third plurality of decode lines are oriented in the first direction, with each decode line coupled to a corresponding local decode line and to one of the first plurality of decode lines.

In some embodiments, a method of configuring a layout of a circuit is disclosed. A plurality of driver clusters are provided. Each driver cluster comprises a plurality of driver circuits. An output of each driver circuit provides a corresponding word line among a plurality of word lines. First and second pluralities of decode signals are provided on first and second pluralities of decode lines, respectively. The first plurality of decode lines are configured to select one of the driver clusters, and the second plurality of decode lines are configured to select one of the driver circuits in the selected driver cluster. A plurality of input lines oriented in a first direction are provided. A plurality of local decode lines are provided. Each local decode line is coupled to the driver circuits of a corresponding driver cluster via corresponding ones of the input lines. A third plurality of decode lines oriented in the first direction are also provided. Each decode line in the third plurality is coupled to a corresponding local decode line and to one of the first plurality of decode lines.

BRIEF DESCRIPTION OF THE DRAWINGS

The following will be apparent from elements of the figures, which are provided for illustrative purposes and are not necessarily to scale.

DETAILED DESCRIPTION

Figure 1:
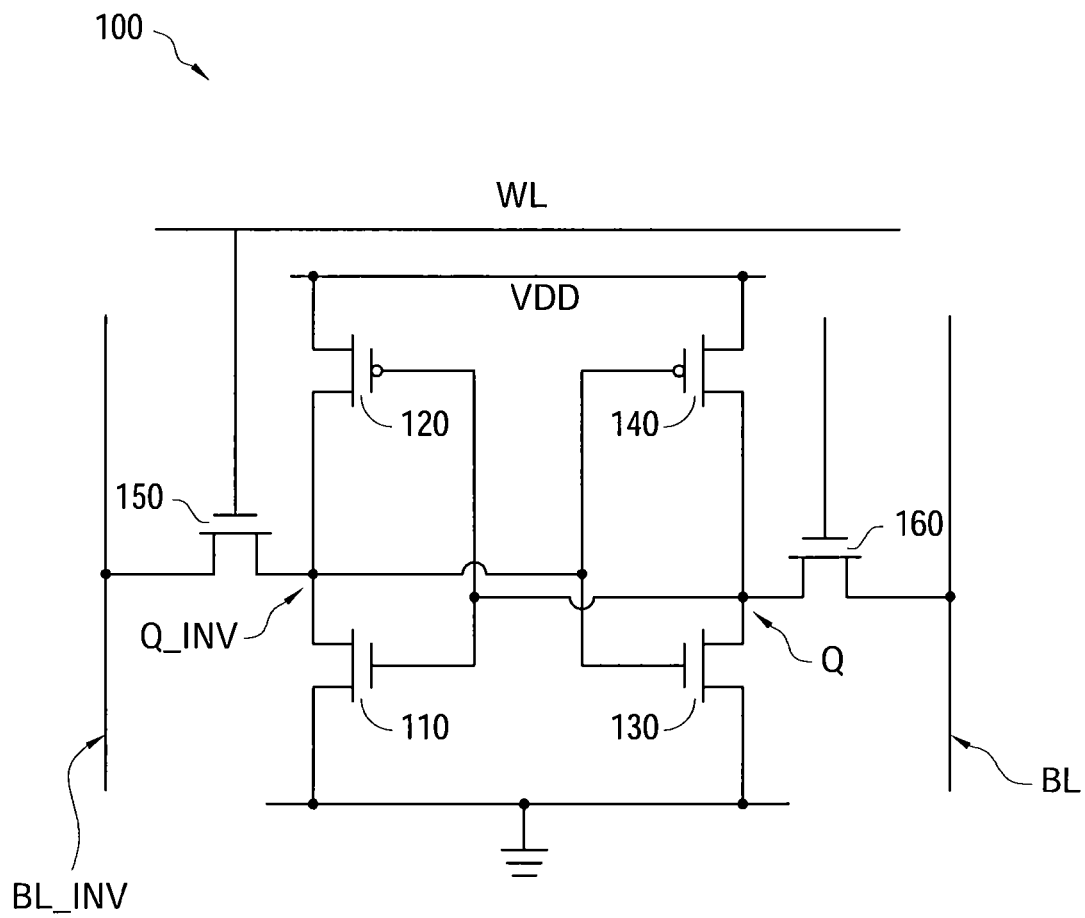
FIG. 1 is a circuit diagram of a static random access memory (SRAM) bitcell.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "vertically," "downwardly," "upwardly," etc.) should be construed to refer to the orientation as then described or as shown in the drawing under discussion. These relative terms are for convenience of description and do not require that the apparatus be constructed or operated in a particular orientation.

Figure 2:
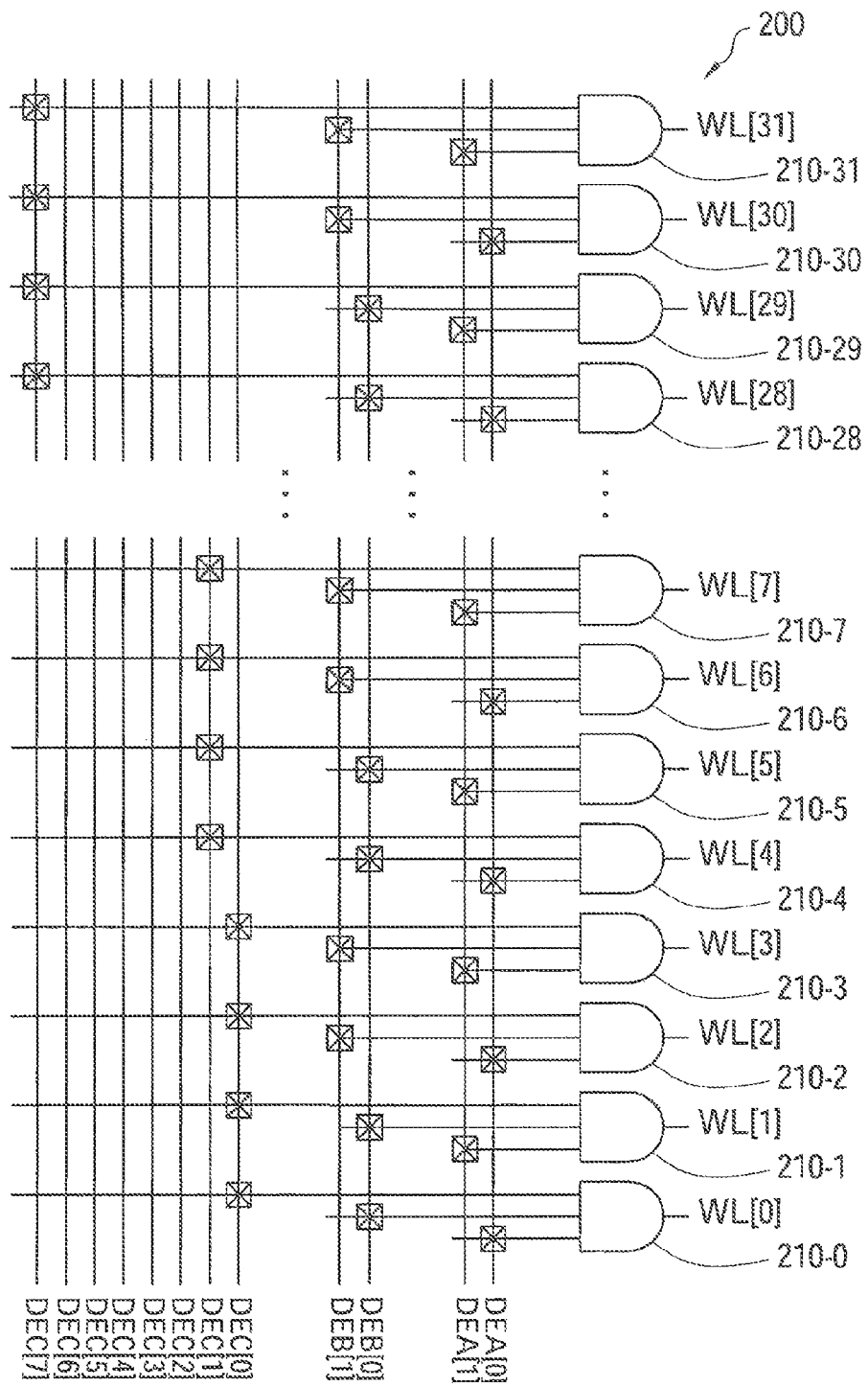
FIG. 2 is a circuit diagram of a word line decoder configured to connect to SRAM bitcells to store multiple data bits.

Word line decoder 200 in FIG. 2 is laid out in a traditional configuration that is simplified for compilable memory. A grid layout formed by decode lines and input lines is straightforward, but word line decoder 200 may have high intrinsic resistance and capacitance. The configuration of word line decoder results in relatively high coupling capacitances and resistances. Such a layout, in which each of the decode lines extends all the way to a distal end of decoder 200 corresponding to the top of FIG. 2 (i.e., all the way to input lines of word line WL[31]) entails a relatively large area for decoder buses.

Figure 3:
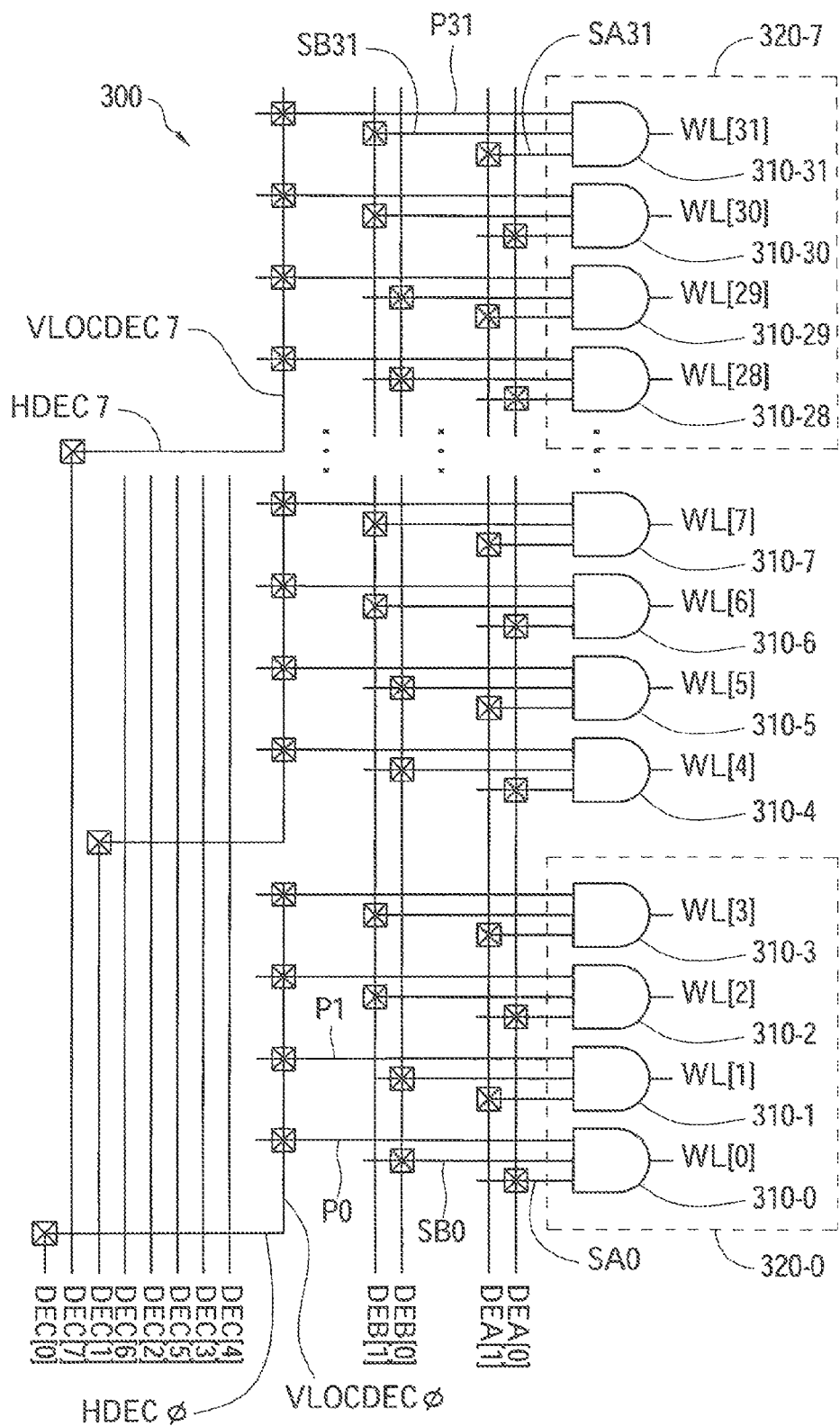
FIG. 3 is a circuit diagram of a word line decoder in accordance with an embodiment.

FIG. 3 is a circuit diagram of a word line decoder 300. Word line decoder 200 has 32 word lines WL[0], . . . WL[31] (generally WL) in the example of FIG. 3, although other numbers of word lines may be used as well. If decode lines DEA[0], DEA[1], DEB[0], DEB[1] are used as in FIG. 3, a minimum of four word lines are used, because those decode lines provide two bits of information to select $2^2$ (i.e., 4) word lines. Driver circuits 310-0, 310-1, . . . , 310-31 (generally 310) provide the word lines WL, and the driver circuits 310 are arranged in clusters 320-0, . . . , 320-7 (generally 320). In the example of FIG. 3, each cluster 320 has four driver circuits 310, resulting in eight clusters; however, different numbers of clusters may be used.

Each driver circuit 310, which may be a logical AND gate, has three input lines. Two of the input lines, denoted SA0 and SB0 in the case of driver circuit 310-0, are referred to as secondary input lines. The secondary input lines are coupled to decode lines DEA[0], DEA[1], DEB[0], and DEB[1], which are referred to as auxiliary decode lines. Within a cluster, e.g., cluster 320-0, the auxiliary decode lines in conjunction with the secondary decode lines determine a particular driver circuit 310. For example, for cluster 320-0, the auxiliary decode lines DEA[0], DEA[1], DEB[0], DEB[1] provide two bits of information that select one of the four driver circuits 310-0, 310-1, 310-2, 310-3. The third input line to each driver circuit 310 is known as a primary input line. The primary input lines to driver circuits 310-0, . . . , 310-31 are denoted P0, . . . , P31 in FIG. 3. The primary and secondary input lines are oriented in a first direction, which may be termed horizontal in the example of FIG. 3. For a given cluster, all of the primary input lines to driver circuits 310 within the cluster are coupled together via a local decode line, which is oriented in a second direction perpendicular to the first direction. The second direction may be termed vertical in the example of FIG. 3. It should be understood that the terms "horizontal" and "vertical" are relative to one another. The local decode lines are denoted with reference characters having suffixes corresponding to the clusters 320. For example, the local decode line connecting the primary input lines of cluster 320-7 is denoted VLOCDEC7, where the prefix 'V' indicates vertical for convenience.

Each local decode line is coupled to a decode line that intersects the local decode line perpendicularly; the latter decode line may be termed a horizontal decode line for convenience and denoted with a prefix 'H'. For example, horizontal decode line HDEC7 is coupled to local decode line VLOCDEC7. It should be understood that the term "horizontal" is relative and indicates that the horizontal decode line is oriented in the same direction as the input lines to the driver circuits 310. Each horizontal decode line is coupled to a cluster decode line, which is oriented in the same direction as the local decode lines (i.e., perpendicular to the horizontal decode line). The cluster decode lines DEC[0], . . . , DEC[7] are so named because each cluster decode line selects a corresponding cluster. For example, cluster decode line DEC[0] selects cluster 320-0, because cluster decode line DEC[0] is coupled via local decode line VLOCDEC0 to each of the driver circuits 310-0, 310-1, 310-2, 310-3 in cluster 320-0 via primary input lines P0, P1, P2, P3, respectively.

There are several differences between the specific example of a word line decoder 300 shown in FIG. 3 and traditional word line decoder 200, although various embodiments may have different subsets of the features shown in FIG. 3. Less circuitry is present in word line decoder 300 (than in decoder 200), because each cluster decode line only extends far enough to connect to its corresponding cluster, i.e., up to an interconnection with its corresponding horizontal decode line. For example, cluster decode line DEC[0] extends from a proximal end of word line decoder 300 only up to the horizontal decode line associated with cluster 320-0 or an insubstantial distance past that horizontal decode line, i.e., up to or insubstantially past horizontal decode line HDEC0, rather than all the way to a distal end of word line decoder 300, where the terms "distal and "proximal" correspond to ends of word line decoder 300 at which clusters 320-0 (a first cluster) and 320-7 (a last cluster), respectively, are disposed. Traditional word line decoder 200 does not have a single horizontal decode line coupled to all of the driver circuits in the corresponding cluster, in contrast to word line decoder 300. With a single horizontal decode line for each cluster, word line decoder 300 reduces circuitry in the horizontal direction (where the term "horizontal" is relative, as discussed above) relative to word line decoder 200. For example, for cluster 320-7, word line decoder 300 has four primary input lines having a length that may be denoted X and one horizontal decode line having a length that may be denoted Y, for a total length of 4X+Y. In contrast, to service driver circuits 310-28, 310-29, 310-30, and 310-31, traditional word line decoder requires four input lines each having a length (X+Y), for a total length of 4X+4Y. Local decode lines, e.g., VLOCDEC0, may be placed close to devices, providing an additional advantage over the prior art.

Figure 4A:
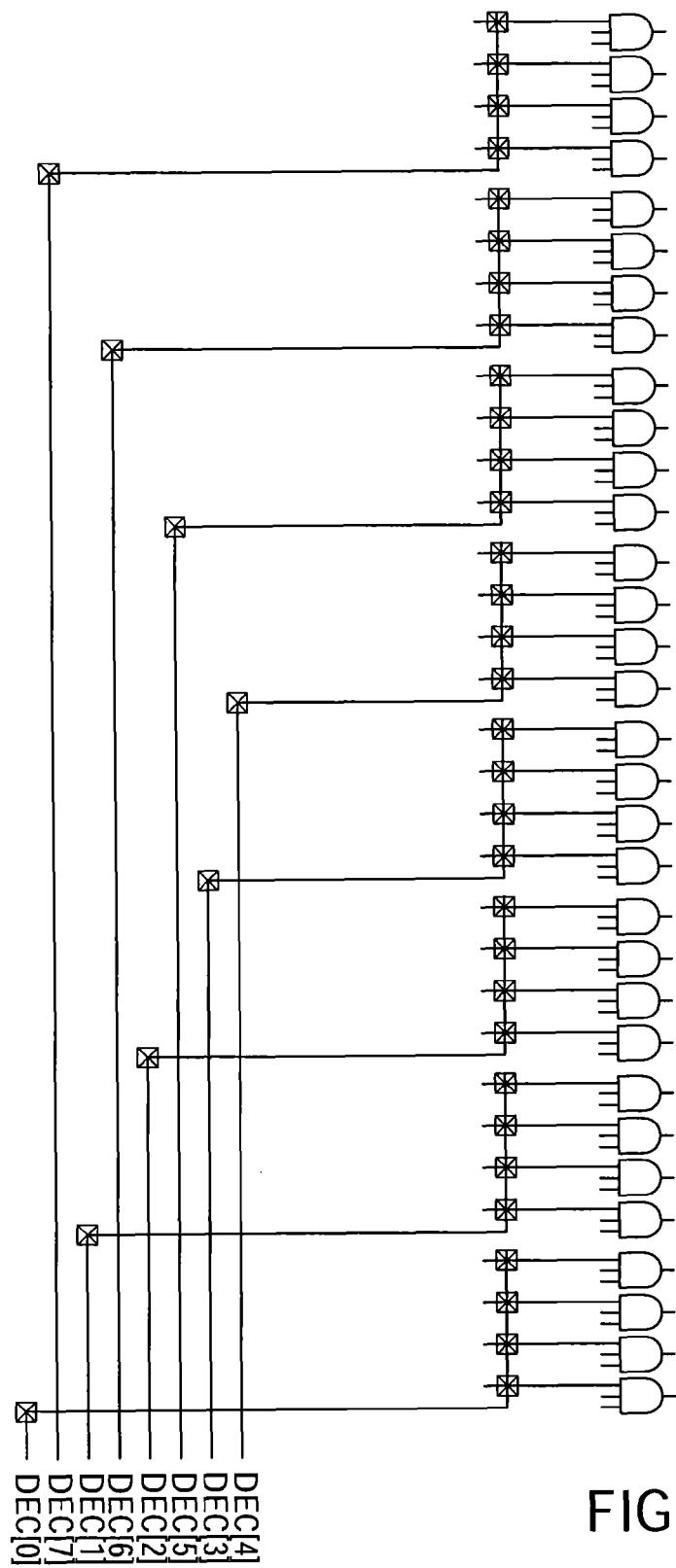
FIGS. 4A-C are circuit diagrams of layouts of cluster decode lines in word line decoders in accordance with various embodiments.
Figure 4B:
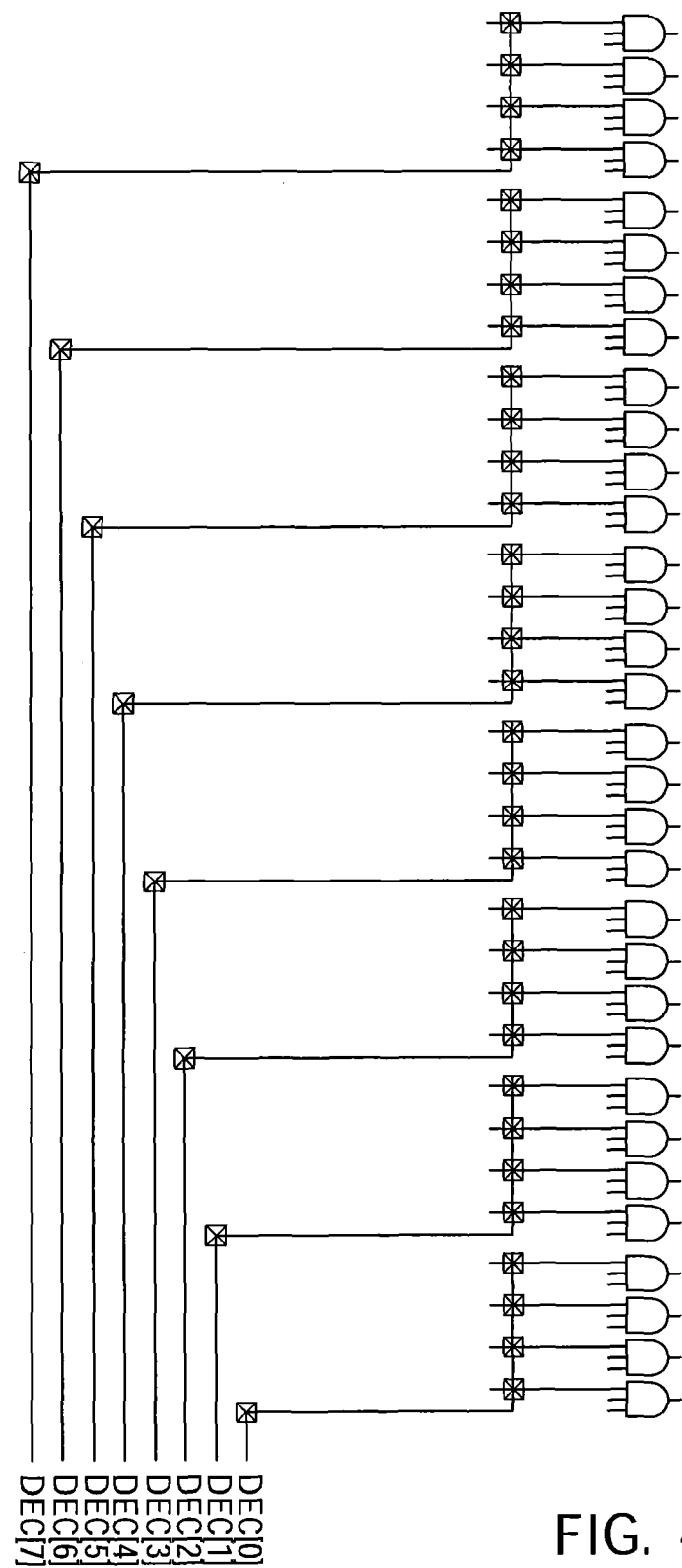
Figure 4C:
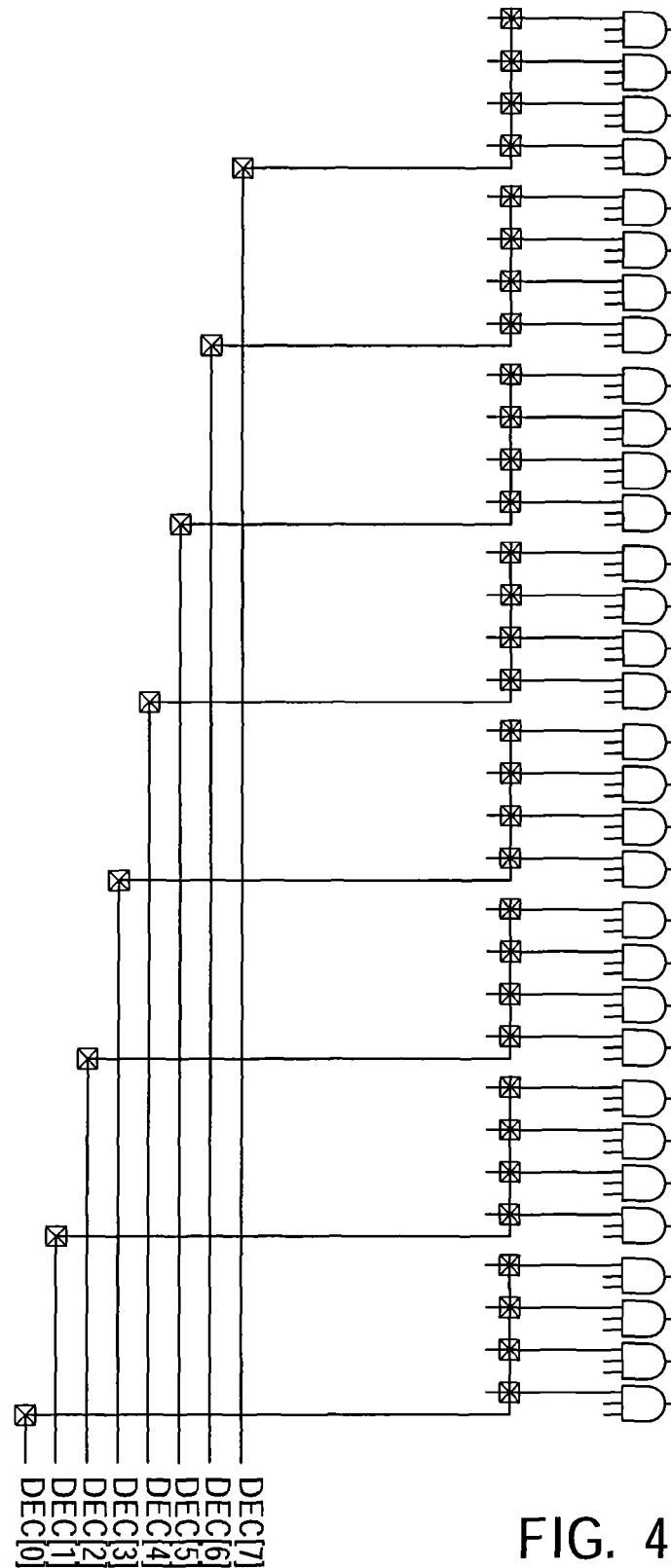

The cluster decode lines DEC[0], DEC[7] are arranged in a particular order in FIG. 3; this order may be understood with reference to FIG. 4A. FIGS. 4A-C are circuit diagrams of layouts of cluster decode lines in word line decoders in accordance with various embodiments, and FIG. 4A shows an example layout that minimizes coupling capacitance and resistance. In FIG. 4A, the cluster decode lines are arranged as DEC[0], DEC[7], DEC[1], DEC[6], DEC[2], DEC[5], DEC[3], DEC[4] in order from left to right, i.e., from farthest to nearest the driver circuits (e.g., AND gates). For convenience, this arrangement may be denoted 0-7-1-6-2-5-3-4. Thus, the shortest cluster decode line DEC[0] (i.e., the cluster decode line corresponding to the cluster at the proximal end of the word line decoder) is adjacent to the longest cluster decode line DEC[7], thus minimizing overlap between the two, which minimizes coupling capacitance by reducing metal loading. Additionally, by reducing the length of cluster decode line DEC[0] relative to the prior art, resistance (which is directly related to length of a line) is minimized as well. The 0-7-1-6-2-5-3-4 arrangement of cluster decode lines as in FIG. 4A minimizes coupling capacitance in a way that may be expressed in the following mathematical formulation: the arrangement maximizes a sum, across the cluster decode lines, of magnitudes of length differences between adjacent cluster decode lines. In other words, the sum |L(0)−L(7)|+|L(7)−L(1)|+|L(1)−L(6)|+(L(6)−L(2)|+|L(2)+L(5)|+|L(5)−L(3)|+|L(3)−L(4)| is a maximum of all possible sums across the cluster decode lines of magnitudes (absolute values) of length differences between adjacent cluster decode lines, where L(i) denotes the length of DEC[i]. Put yet another way, the cluster decode lines are arranged to minimize the sum of the overlaps between the adjacent cluster decode lines in each pair. Other arrangements that satisfy the sum-maximization property above are 4-3-5-2-6-1-7-0 (the reverse of the above arrangement), 7-0-6-1-5-2-4-3, and 3-4-2-5-1-6-0-7, for example. One of ordinary skill in the art recognizes that the same criteria for arrangement of cluster decode lines may be extended to any given number of clusters, and to any given number of driver circuits per cluster.

Although 32 word lines are shown in FIGS. 3 and 4A-C, other numbers of word lines may be used, as mentioned above. For example, 128 or 512 word lines may be used. For example, in the case of 128 word lines, cluster decode lines DEC[0], . . . , DEC[7] providing three bits of information may select between eight (i.e., $2^3$) clusters, each having sixteen driver circuits, which may be selected via appropriate auxiliary decode lines. Similarly, for 512 word lines, eight cluster decode lines may select between eight clusters having 64 driver circuits each. More benefit is achieved (relative to the prior art) with larger numbers of word lines. The provision of auxiliary decode lines and cluster decode lines, and the relative provision of auxiliary decode lines between different input lines to driver circuits, may be adjusted in the context of a particular implementation, as one of ordinary skill in the art should understand.

Other arrangements may arrange the cluster decode lines by decreasing or increasing length, as in FIGS. 4B and 4C. These arrangements may be expressed in the following mathematical formulation: these arrangements minimize (rather than maximize as above) a sum, across the cluster decode lines, of magnitudes of length differences between adjacent cluster decode lines. Any other arrangement of cluster decode lines is possible as well, i.e., any of the p! arrangements may be used in a case of p cluster decode lines.

Figure 5:
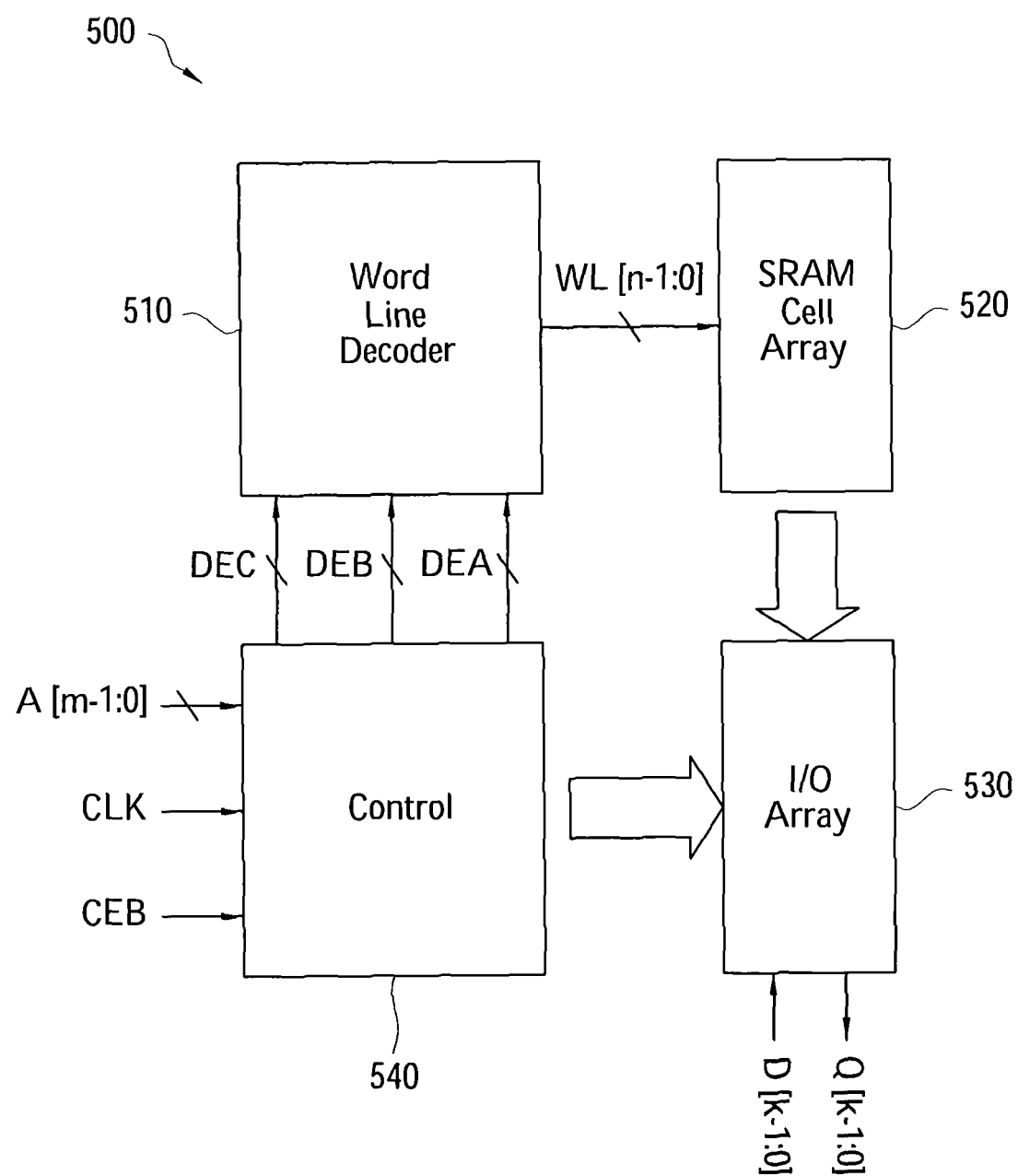
FIG. 5 is a block diagram of a memory system in accordance with an embodiment.

FIG. 5 is a block diagram of a memory system. A memory system 500 has a word line decoder 510, an SRAM cell array 520, an input/output (I/O) array 530, and a control logic 540. FIG. 5 may also be considered to provide a top view of SRAM blocks. Word line decoder 510 may be the word line decoder 300 of FIG. 3 or a similar word line decoder with different numbers of decode lines and/or word lines. Word line decoder 500 is shown in FIG. 5 to have n word lines that address n bitcells in SRAM cell array 520. I/O array 530 may be a conventional input/output array, known in the art, for writing data (denoted D in FIG. 5) to or reading data (denoted Q in FIG. 5) from SRAM cell array 520, or a future developed I/O array having these functions. Control logic 540 receives an address (shown as comprising m bits in FIG. 5), a clock signal, and a chip enable signal CEB to control accessing of and read/writes to/from the SRAM cell array 520. Control logic 540 translates address A[m-1:0] into decode signals provided on decode lines DEA and DEB (auxiliary decode lines as described above) and DEC (cluster decode lines as described above). The word line decoder is referred to as a word line driver array in FIG. 5.

Figure 6:
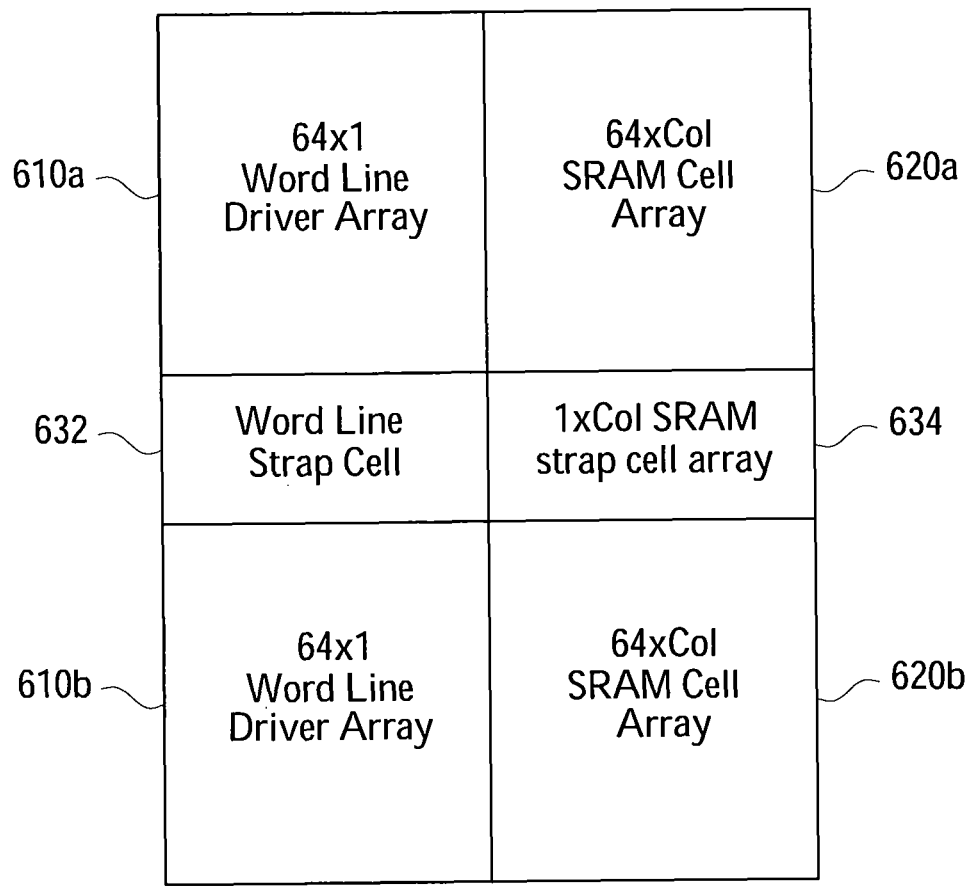
FIG. 6 is a block diagram of a strap cell configuration of a memory system in accordance with an embodiment.

FIG. 6 is a block diagram of a strap cell configuration of a memory system. An SRAM strap cell is a standard cell used to fill in an SRAM cell array to drop bias voltages to a P-well and to an N-well, as is known to one of ordinary skill in the art. The P-well (P-type substrate) and N-well bias are the bulk (sometimes referred to as body) of an NMOS and PMOS device, respectively.

An SRAM strap cell may be placed every fixed number of SRAM cells (bitcells), i.e., every k bitcells. In FIG. 6, a word line strap cell 632 is disposed between adjacent 64×1 word line driver arrays (word line decoders) 610a, 610b, which are adjacent to SRAM cell arrays 620a, 620b having 64 rows and Col columns. An SRAM strap cell array having one row and Col columns is disposed between SRAM cell arrays 620a and 620b. The maximum allowed number of rows in an SRAM cell array is limited by a maximum distance from a well bias to a farthest SRAM cell, which is typically about 30 μm according to design specifications for a 65 nm CMOS fabrication process. A horizontal decode line as in FIG. 3 (e.g., HDEC0) may be implemented in strap cell 632 or in SRAM strap cell array 634. Alternatively, the horizontal decode line may be implemented in local control logic as described below in the context of FIG. 7.

Figure 7:
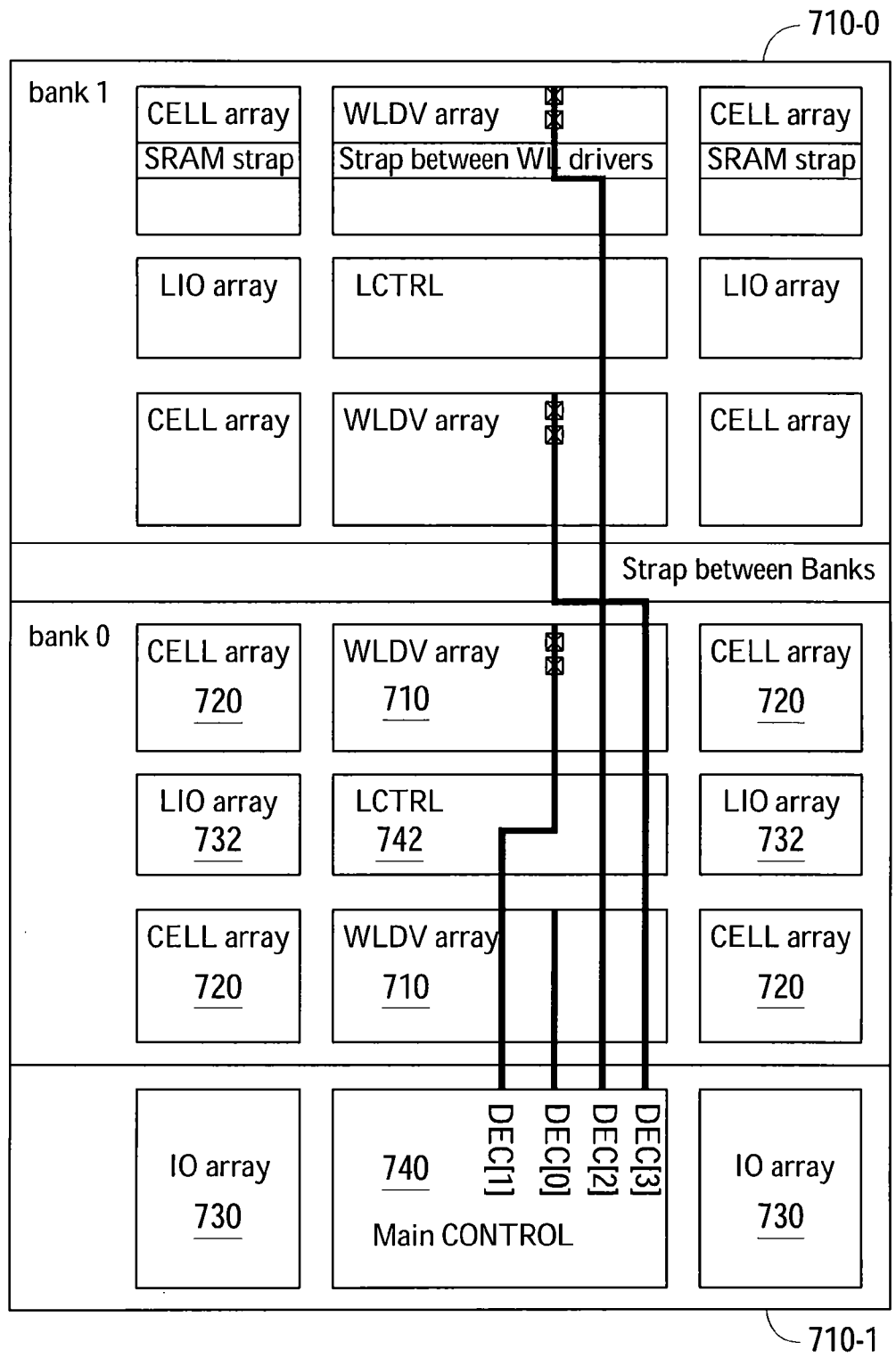
FIG. 7 is a block diagram of a an array of memory banks in accordance with an embodiment.
Figure 8:
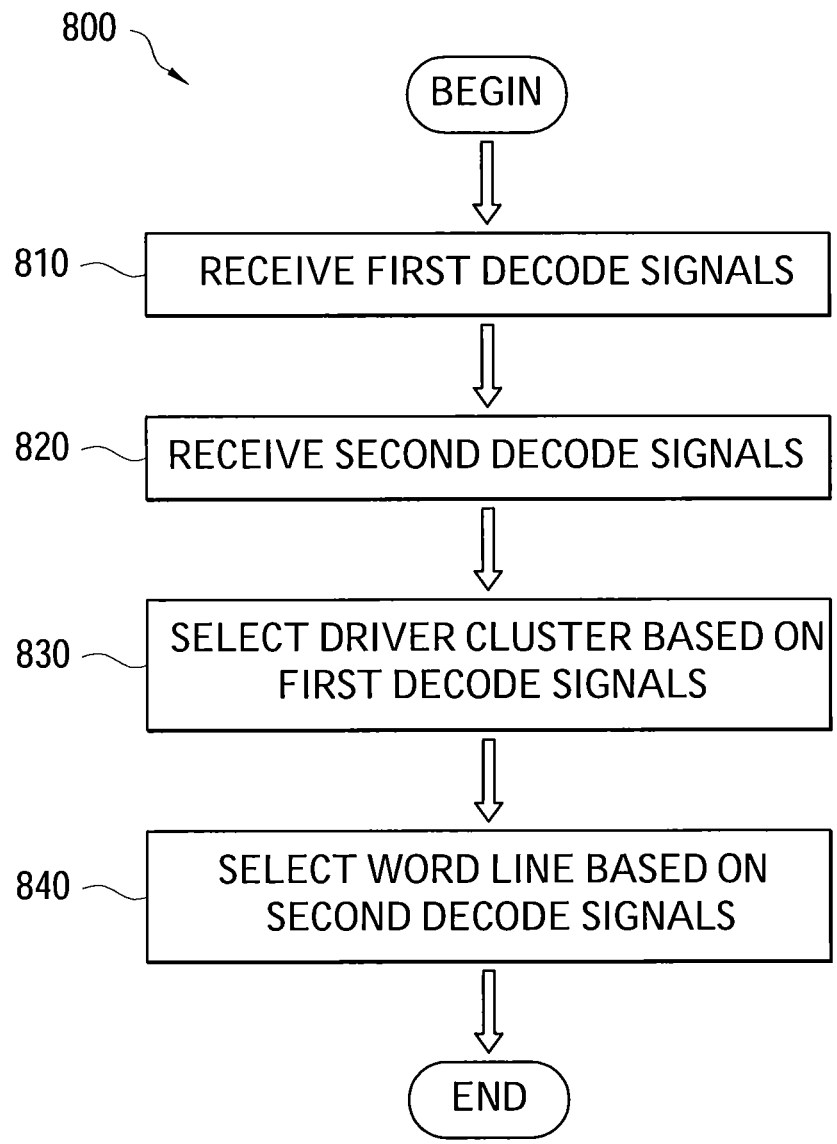
FIG. 8 is a flow diagram of a process in accordance with some embodiments.

FIG. 7 is a block diagram of an array of memory banks. Memory banks 710-0, 710-1 are structures similar to memory system 500 of FIG. 5. Memory bank 1 has SRAM cell arrays 720, a word line driver array 710, a local control logic 742, a local input/output (LIO) array 732, an I/O array 730 and main control 740. Main control 740 provides decode signals DEC[0], DEC[1], DEC[2], and DEC[3] as in FIG. 3; other decode signals are not shown in FIG. 7. Local control 742 controls the LIO array 732 for reading and writing like a local read circuit or a local write data buffer. The local read circuit may include a differential amplifier for sensing the voltage difference between signals BL and BL_INV as in FIG. 1. Horizontal decode lines may pass through local control 742 at any location where there is sufficient metal space for a metal, pitch. Various embodiments have been tested and have exhibited decreased coupling capacitance, decreased resistance, decreased power consumption, and better timing performance (faster accesses) relative to prior art word line decoders. Table 1 shows decreased coupling capacitance in an embodiment with 128 word lines.

TABLE 1

| Pre-decoder capacitance (fF) for 128 word line rows | Traditional word line decoder | Word line decoder in accordance with an embodiment | % difference |
|---|---|---|---|
| DEC[0] | 22.11 | 10.24 | −53.7% |
| DEC[1] | 21.35 | 11.87 | −44.4% |
| DEC[2] | 21.56 | 12.85 | −40.4% |
| DEC[3] | 22.82 | 14.04 | −38.5% |
| DEC[4] | 21.69 | 14.40 | −33.6% |
| DEC[5] | 22.20 | 16.12 | −27.4% |

TABLE 1-continued

| Pre-decoder capacitance (fF) for 128 word line rows | Traditional word line decoder | Word line decoder in accordance with an embodiment | % difference |
|---|---|---|---|
| DEC[6] | 21.83 | 17.28 | −20.9% |
| DEC[7] | 21.16 | 18.04 | −14.8% |

Table 2 shows improved timing performance (access time) for a 32 Kb register file in accordance with an embodiment.

TABLE 2

|  | Access time (ns) | Active current (µA/MHz) |
|---|---|---|
| Traditional word line decoder | 0.435 | 8.506 |
| Word line decoder in accordance with an embodiment | 0.416 | 8.337 |
| Improvement (%) | −4.3% | −2.0% |

Although examples are illustrated and described herein, embodiments are nevertheless not limited to the details shown, since various modifications and structural changes may be made therein by those of ordinary skill within the scope and range of equivalents of the claims.

What is claimed is:

1. A word line decoder comprising: a plurality of driver circuits; a plurality of word lines provided at respective outputs of the driver circuits; a plurality of primary input lines coupled to the driver circuits, the primary input lines oriented in a first direction; a plurality of secondary input lines coupled to the driver circuits, the secondary input lines oriented in the first direction; a local decode line coupled to each of the primary input lines; a decode line coupled to the local decode line, the decode line oriented in the first direction; and a cluster decode line coupled to the decode line, wherein the cluster decode line is different than the local decode line, one end of the decode line is joined to the local decode line, and another end of the decode line is directly joined to the cluster decode line; wherein the word line decoder is configured to select at least one of the word lines based on signals provided by the cluster decode line and the secondary input lines, wherein the cluster decode line is oriented in a second direction perpendicular to the first direction and is configured to terminate at or an insubstantial distance past an interconnection with the decode line.

2. The word line decoder of claim 1, wherein the driver circuits, primary input lines, and secondary input lines define a first driver cluster; and wherein the word line decoder further comprises:
additional driver clusters, N in total;
additional local decode lines, N in total, each local decode line coupled to the primary input lines of a corresponding driver cluster;
additional decode lines, N in total, each decode line coupled to a corresponding local decode line;
additional cluster decode lines, N in total, each cluster decode line coupled to a corresponding decode line.

3. The word line decoder of claim 2, wherein each decode line is coupled to a proximal end of a corresponding local decode line.

4. The word line decoder of claim 3, wherein a longest cluster decode line is disposed next to a shortest cluster decode line.

5. The word line decoder of claim 4, wherein the cluster decode lines are arranged to maximize a sum, across the cluster decode lines, of magnitudes of length differences between adjacent cluster decode lines.

6. The word line decoder of claim 3, wherein the cluster decode lines are arranged in increasing order by length.

7. The word line decoder of claim 2, wherein each decode line is disposed in a strap cell between adjacent driver clusters.

8. The word line decoder of claim 1, comprising at least four word lines.

9. The word line decoder of claim 1, wherein the driver circuits are logical AND gates.

10. A memory device comprising:
a plurality of word lines;
a plurality of static random access memory (SRAM) cells configured to store a plurality of data bits, each cell activated by a corresponding word line;
a control logic configured to provide first and second pluralities of decode signals on first and second pluralities of decode lines, respectively;
an input/output array configured to read and write the data bits based on input from the control logic; and
a word line decoder comprising:
a plurality of driver clusters, each driver cluster comprising a plurality of driver circuits, an output of each driver circuit providing a corresponding word line;
a plurality of local decode lines, each local decode line coupled to the driver circuits of a corresponding driver cluster via corresponding ones of a plurality of input lines oriented in a first direction; and
a third plurality of decode lines oriented in the first direction, each decode line in the third plurality coupled at one end to a corresponding local decode line and directly coupled at another end to one of the first plurality of decode lines, wherein the first plurality of decode lines are not oriented in the first direction.

11. The memory device of claim 10, wherein each of the first plurality of decode lines is oriented in a second direction perpendicular to the first direction and is configured to terminate at or an insubstantial distance past an interconnection with a corresponding one of the third plurality of decode lines.

12. The memory device of claim 11, wherein each of the third plurality of decode lines is coupled to a proximal end of a corresponding local decode line.

13. The memory device of claim 12, wherein a longest one of the first plurality of decode lines is disposed next to a shortest one of the first plurality of decode lines.

14. The memory device of claim 13, wherein the first plurality of decode lines are arranged to maximize a sum, across the first plurality of decode lines, of magnitudes of length differences between adjacent ones of the first plurality of decode lines.

15. The memory device of claim 13, wherein the first plurality of decode lines are arranged in increasing order by length.

16. A method of configuring a layout of a circuit, the method comprising:
providing a plurality of driver clusters, each driver cluster comprising a plurality of driver circuits, an output of each driver circuit providing a corresponding word line among a plurality of word lines;
providing first and second pluralities of decode signals on first and second pluralities of decode lines, respectively, the first plurality of decode lines configured to select one of the driver clusters and the second plurality of decode lines configured to select one of the driver circuits in the selected driver cluster;

providing a plurality of input lines oriented in a first direction;

providing a plurality of local decode lines different than the first plurality of decode lines, each local decode line coupled to the driver circuits of a corresponding driver cluster via corresponding ones of the input lines; and providing a third plurality of decode lines oriented in the first direction, each decode line in the third plurality coupled at one end to a corresponding local decode line and at another end to one of the first plurality of decode lines, wherein the first plurality of decode lines are not oriented in the first direction.

17. The method of claim 16, wherein each of the first plurality of decode lines is oriented in a second direction perpendicular to the first direction and is configured to terminate at or an insubstantial distance past an interconnection with a corresponding one of the third plurality of decode lines.

18. The method of claim 17, wherein each of the third plurality of decode lines is coupled to a proximal end of a corresponding local decode line.

19. The method of claim 18, wherein a longest one of the first plurality of decode lines is disposed next to a shortest one of the first plurality of decode lines.

* * * * *